United States Patent [19]

Mitsui et al.

[11] Patent Number: 5,702,567
[45] Date of Patent: Dec. 30, 1997

[54] PLURALITY OF PHOTOLITHOGRAPHIC ALIGNMENT MARKS WITH SHAPE, SIZE AND SPACING BASED ON CIRCUIT PATTERN FEATURES

[75] Inventors: Tadashi Mitsui; Katsuhiko Hieda, both of Wappingers Falls, N.Y.

[73] Assignee: Kabushiki Kaisha Toshiba, Japan

[21] Appl. No.: 457,670

[22] Filed: Jun. 1, 1995

[51] Int. Cl.[6] .............................................. H01L 23/544
[52] U.S. Cl. .............................. 156/644.1; 156/662.1; 437/225; 437/228; 437/924
[58] Field of Search .................... 156/662.1, 644.1; 437/225, 228, 924; 257/797

[56] References Cited

U.S. PATENT DOCUMENTS

| | | | |
|---|---|---|---|
| 4,315,201 | 2/1982 | Suzuki et al. | 318/640 |
| 4,338,620 | 7/1982 | Kawabe | 257/797 |
| 4,377,028 | 3/1983 | Imahashi | 29/574 |
| 4,377,436 | 3/1983 | Donnelly et al. | 156/626 |
| 4,390,279 | 6/1983 | Suwa | 356/401 |
| 4,423,959 | 1/1984 | Nakazawa et al. | 356/400 |
| 4,441,250 | 4/1984 | Imahashi | 29/578 |
| 4,566,795 | 1/1986 | Matsuura et al. | 356/400 |
| 4,655,598 | 4/1987 | Murakami et al. | 356/400 |
| 4,702,606 | 10/1987 | Matsuura et al. | 356/401 |
| 4,723,221 | 2/1988 | Matsuura et al. | 364/559 |
| 4,769,523 | 9/1988 | Tanimoto et al. | 219/121.6 |
| 4,794,648 | 12/1988 | Ayata et al. | 382/8 |
| 4,952,274 | 8/1990 | Abraham | 156/643 |
| 4,954,214 | 9/1990 | Ho | 156/628 |
| 5,026,660 | 6/1991 | Dutt et al. | 437/80 |
| 5,157,003 | 10/1992 | Tsuji et al. | 437/225 |
| 5,164,330 | 11/1992 | Davis et al. | 437/192 |
| 5,231,052 | 7/1993 | Lu et al. | 437/190 |
| 5,242,538 | 9/1993 | Hamrah et al. | 156/643 |
| 5,268,070 | 12/1993 | Nagayama et al. | 156/662 |
| 5,277,740 | 1/1994 | Yoneda | 156/345 |
| 5,286,673 | 2/1994 | Nishihara | 437/228 |
| 5,291,536 | 3/1994 | Itoh et al. | 378/35 |
| 5,300,460 | 4/1994 | Collins et al. | 437/225 |
| 5,302,236 | 4/1994 | Tahara et al. | 156/643 |
| 5,320,708 | 6/1994 | Kadomura et al. | 156/662 |
| 5,330,607 | 7/1994 | Nowicki | 156/345 |
| 5,354,417 | 10/1994 | Cheung et al. | 156/643 |
| 5,354,421 | 10/1994 | Tatsumi et al. | 156/662 |
| 5,356,515 | 10/1994 | Tahara et al. | 156/643 |
| 5,475,268 | 12/1995 | Kawagoe et al. | 257/797 |
| 5,525,840 | 6/1996 | Tominaga | 437/924 |

FOREIGN PATENT DOCUMENTS

| | | |
|---|---|---|
| 63-194329 | 8/1988 | Japan . |
| 2-12807 | 1/1990 | Japan . |

OTHER PUBLICATIONS

Farrow et al "Mark topography for alignment and registration in projection electron lithography" Proc. SPIE–Int. Soc. Opt. Eng. 2723, 143–149 abstract only, 1996.

*Primary Examiner*—R. Bruce Breneman
*Assistant Examiner*—Anita Alanko
*Attorney, Agent, or Firm*—Banner & Witcoff, Ltd.

[57] ABSTRACT

Photolithographic alignment marks (e.g., mask and measurement overlay marks) are formed of a pattern of very small marks using the design configuration and rule of a circuit pattern feature. A relatively large mark comprising a pattern of small marks modeled after the circuit pattern feature results in an etch rate within the mark area that is substantially the same as the etch rate in the circuit pattern (e.g., cell or peripheral circuit) area. This allows for simultaneous formation of circuit pattern features, and the alignment marks, in a common etching step, while avoiding underetching (shallow etch depth) due to a microloading effect. In this manner, proper formation of readily detectible marks is ensured.

13 Claims, 3 Drawing Sheets

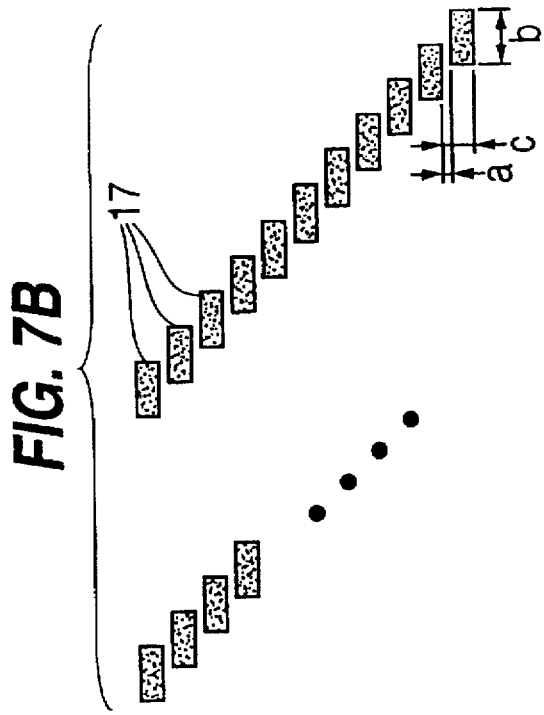
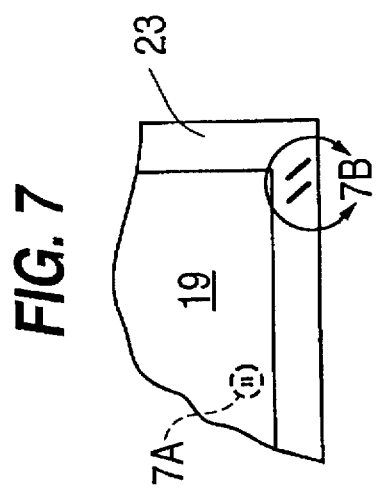
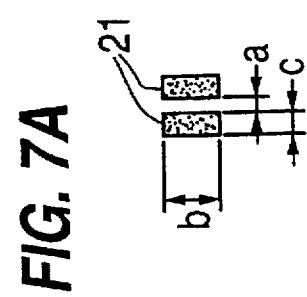

PLURALITY OF PHOTOLITHOGRAPHIC ALIGNMENT MARKS WITH SHAPE, SIZE AND SPACING BASED ON CIRCUIT PATTERN FEATURES

BACKGROUND OF THE INVENTION

The present invention relates to the fabrication of semiconductor integrated circuits. More specifically, the invention concerns the formation of marks used to align a mask or measurement overlay with a semi-conductor wafer in a photolithographic exposure apparatus, e.g., stepper or scanner.

The term "wafer" as used herein is intended to refer generally to a semiconductor substrate from which a plurality of individual chips are formed, including substrates having circuit patterns, devices and/or alignment marks formed thereon. The term is also intended to generally encompass in-process and finished semiconductor chips.

In known VLSI photolithographic processes for the production of semiconductor integrated circuits, a mask comprising a desired circuit pattern must be precisely aligned with a semiconductor wafer, or with a pattern formed on the wafer, in order to ensure proper placement of the projected image. In order to increase integration density, VLSI chips typically employ multiple layers formed by successive image projection steps. In the photo-fabrication of such multi-layer semi-conductor devices, the precise registry of the successive images is extremely critical.

Measurement overlays are used to confirm that successively projected circuit patterns have been positioned accurately with respect to each other. Obviously, the accuracy of overlay measurements depends on the accurate and precise alignment of the measurement overlays with the wafer and the circuit patterns to be checked. While the following discussion focuses principally on the problems encountered in the formation and detection of photolithographic mask alignment marks, it will be understood that similar problems exist with respect to overlay measurement marks as well, and that the present invention is applicable to both.

To obtain the necessary mask to wafer alignment, marks are placed in peripheral (kerf) regions of the mask and the wafer, respectively. These marks are detected by a photo-optical detector of the exposure tool to ascertain the precise relative positions of the mask and wafer. Then, a precision stage metrology system is used to bring the wafer and mask into proper registry.

Mask alignment marks are provided in a variety of shapes, patterns and configurations, depending upon the particular type of photo-optical detection system being utilized. Exemplary mask-wafer alignment marks and systems are described and shown in the following U.S. patents: Ayata et at. U.S. Pat. No. 4,794,648; Tanimoto et al. U.S. Pat. No. 4,769,523; Matsuura et al. U.S. Pat. No. 4,723,221; Matsuura et at. U.S. Pat. No. 4,702,606; Murakami et at. U.S. Pat. No. 4,655,598; Matsuura et at. U.S. Pat. No. 4,566,795; Imahashi U.S. Pat. No. 4,441,250; Nakazawa et al. U.S. Pat. No. 4,423,959; Imahashi U.S. Pat. No. 4,377,028; Suwa U.S. Pat. No. 4,390,279; and Suzuki et al. U.S. Pat. No 4,315,201.

Mask alignment marks can be formed on a wafer by an additive method wherein a layer of material, e.g., chrome, is deposited on the substrate, or by a subtractive method wherein the marks are formed by etching the substrate directly. To reduce process steps and thereby attain greater production efficiency, it is desirable to combine the step of forming the alignment marks with the steps used to form the desired circuit pattern. Thus, for example, in a process for forming deep trenches to be used as capacitive elements or for device isolation, the deep trenches may be formed by selective reactive ion etching (RIE). In this step, it is possible to also etch the alignment marks to be used for alignment of a subsequently applied mask or measurement overlay. This can be accomplished by simply including in the mask and resist patterns used to form the circuit elements an additional pattern for creating alignment marks, e.g., in the kerf region(s) of the wafer.

To ensure proper detection and position determination by the photo-optical detector of the scanner or stepper, it is generally necessary to provide alignment marks on the chip which are substantially larger than the design rule of a VLSI circuit design. For example, in accordance with the 256 M DRAM design rule, a deep trench has a generally rectangular shape measuring 0.55–0.8 μm by 0.3 μm, providing an etchable area of between 0.165 and 0.24 μm$^2$. A DRAM circuit pattern 1 comprising an array of deep trenches is illustrated in FIG. 1. Typically, the deep trenches are spaced from one another by about 0.25 μm. On the other hand, conventional alignment marks formed at the deep trench (DT) level typically comprise, as shown in FIG. 2, elongated line-shaped holes 3 having a width of between 0.5 and 1.4 μm and a length of 70 μm, providing a much larger etchable area of 35 to 98 μm$^2$. The alignment marks of each alignment mark pair are generally spaced from one another by about 10 μm.

When a single reactive ion etching step is used to form the alignment marks and deep trenches simultaneously, a problem has been found to arise with proper detection of the marks. The problem, the inventors found, is particularly acute in the case of formation of deep trench capacitive elements of a DRAM chip, wherein the deep trenches are filled with polysilicon and then back-etched. Typically, the polysilicon filling of the trenches is accomplished by a blanket deposition of polysilicon on a patterned resist layer, such as by chemical vapor deposition (CVD). This step is followed by a chemical mechanical polishing (CMP) operation to planarize the surface and remove excess polysilicon from areas outside of the deep trenches. In this process, the elongated holes used to form the alignment marks are also filled with polysilicon and that polysilicon remains after the CMP operation. A subsequent RIE process is used to etch back the polysilicon within the deep trenches to a point slightly (e.g., 50 nm) below the surface of the silicon substrate. This etch-back step is simultaneously performed with respect to the alignment marks as well. However, within the alignment mark areas, the polysilicon etch-back depth may be insufficient to allow for proper detection of the marks by the detection apparatus.

For example, as shown in FIG. 3, the polysilicon etch back within deep trench 5 extends through an SiN film 7 and a desired distance "a" (e.g., 50 nm) below the surface of the silicon substrate. On the other hand, the resultant etch-back of the polysilicon within the alignment mark area 9 is significantly shallower, leaving the polysilicon level 11 within mark area 9 approximately level with the silicon substrate surface 13.

In one test involving alignment of gate conductor (GC) and deep trench (DT) levels, two out of 10 lots failed to produce a proper DT alignment signal. As seen in FIG. 3, one factor found to contribute to the insufficient etch depth of the marks was a difference (A-B) in the thickness of the SiN layer between the mark area and circuit pattern (cell) area following CMP polishing. This does not fully account for the problem of insufficient etch depth, however.

Under the above-described circumstances, the alignment marks are not reliably detectible using conventional edge or step height triggered photo-optical detecting apparatus. As a result, precise alignment of a mask and/or measurement overlay cannot be assured.

SUMMARY OF THE INVENTION

It is a principal object of the present invention to overcome the aforementioned problems associated with attempts to form reliably detectible mask or measurement overlay alignment marks on a semiconductor wafer.

In particular, it is an object of the invention to provide a fabrication technique that ensures reliable formation of readily detectable alignment marks using an etching step also used in the process to form a circuit pattern feature.

It is a more specific object of the present invention to provide a semiconductor integrated circuit fabrication process utilizing an alignment mark configuration which is not, in the etching step, prone to incomplete etching due to a microloading effect.

A further specific object of the present invention is to provide a technique that allows for reliable simultaneous formation of a cell area including polysilicon filled, etched-back, deep trenches, and an alignment mark area, e.g., kerf, including alignment marks that are readily detected using conventional photo-optical detecting equipment.

These and other objects are achieved in accordance with a first aspect of the present invention by a semiconductor integrated circuit fabrication process comprising simultaneously forming a circuit pattern feature and a photolithographic alignment mark on a semiconductor wafer by etching. The alignment mark is formed as a composite mark comprising a plurality of small marks. The small marks are sufficiently close in shape, size and spacing to the circuit pattern feature that an etch rate within an area of the circuit pattern feature and an etch rate within an area of each small mark are substantially the same.

The present invention is also embodied in a semiconductor wafer comprising an etched circuit pattern feature and an etched photolithographic alignment mark. The alignment mark is formed as a composite mark comprising a plurality of small marks. The small marks each have an etch area that is no larger than twice that of the circuit pattern feature, and a length dimension that is no larger than twice the length of the circuit pattern feature.

These and other objects, features and advantages of the present invention will be evident and fully understood from the following detailed description of the preferred embodiments.

BRIEF DESCRIPTION OF THE DRAWINGS

FIG. 7 is a simplified top plan view of a semiconductor wafer, with blown-up portions, illustrating the relationship of deep trenches formed in a circuit pattern (cell area) of a chip to small marks of composite alignment marks formed in an alignment mark (kerf) area of the chip.

DETAILED DESCRIPTION OF THE PREFERRED EMBODIMENTS

Figure 1:
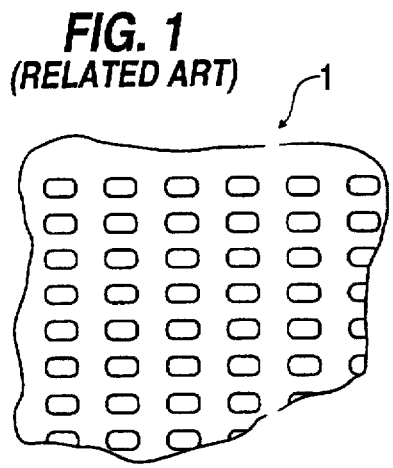
FIG. 1 is a fragmented top plan view of a circuit pattern (cell) area of a related art semiconductor wafer having formed therein an array of deep trenches.
Figure 2:
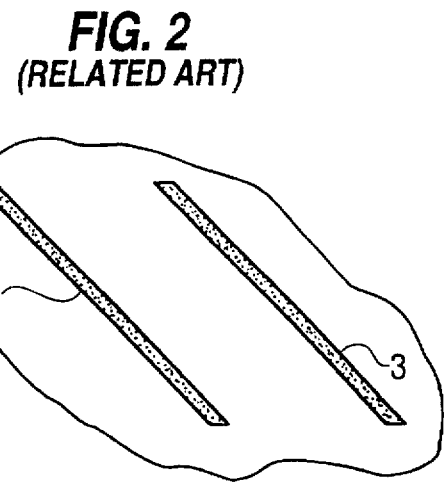
FIG. 2 is a fragmented top plan view of an alignment mark area (e.g., kerf region) of a related art semiconductor wafer, having formed therein a pair of conventional alignment marks.
Figure 3:
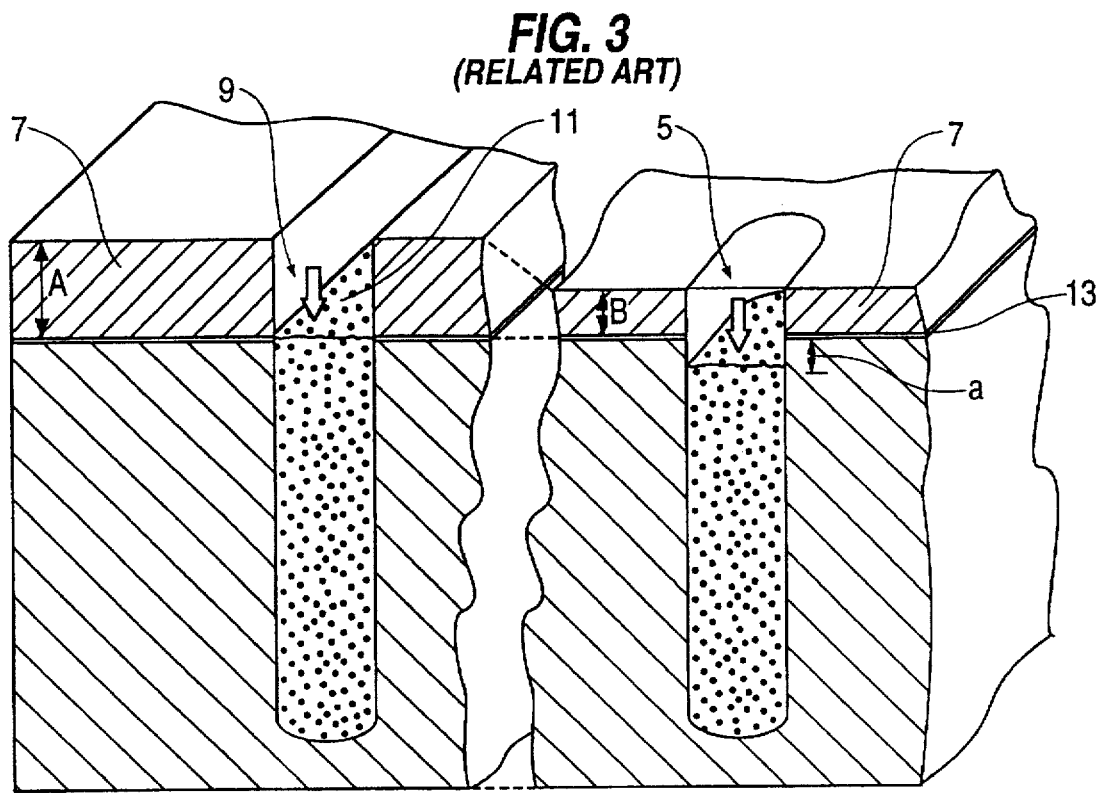
FIG. 3 is a sectioned and fragmented perspective view of a related art semiconductor wafer comprising deep trenches and conventional mask alignment marks, illustrating the problem of shallow etch depth addressed by the present invention.

The inventors discovered that a significant factor contributing to the insufficient etch depth illustrated in FIG. 3 is related to the configuration of the alignment marks. More specifically, the inventors discovered that the shallow etch depth occurring in the mark areas was also due to the relatively large etch area and spacing of the alignment marks. The inventors recognized that a microloading effect was causing the etching of the relatively large and widely spaced (isolated) alignment marks to proceed at a significantly reduced rate as compared to the etching of the relatively small and closely spaced deep trenches. Since the etching time is precisely controlled based on the required etch depth within the deep trenches, and SEM data taken at the deep trench cell array, a shallow etch depth in the mark areas often results, rendering the alignment marks undetectable.

It is to be noted that the microloading effect observed in this case is opposite the microloading phenomena that is commonly known, wherein the etching rate increases with an increase in the size of the etch area. Although the reason for the opposite effect is not fully understood, the following is one possible explanation. During the reactive ion etch, a deposition phenomena simultaneously occurs at the etching surface due to the formation of chemical by-products. Such deposition tends to inhibit the etch process. With a small diameter trench bottom, deposition does not occur easily due to the high aspect ratio. On the other hand, deposition occurs more easily in the relatively large etch area of the alignment marks, leading to a slower etching rate there.

In order to solve the aforementioned problem, mask or measurement overlay alignment marks are formed from a pattern (army) of small marks shaped, sized and spaced from each other based on the configuration of the circuit pattern features to be formed in the same process steps. Thus, for example, in the case of a circuit pattern comprising an array of polysilicon filled, etched-back deep trenches, the alignment marks are formed as composite marks comprising an array of smaller marks having the same or substantially the same shape, size and spacing as the deep trenches. In this manner, a mark having the desired overall shape and size as the conventional alignment marks can be produced. At the same time, the relatively large etch area of the conventional marks is reduced to a plurality of small etch areas corresponding in shape, size and spacing to the circuit feature(s) being formed. As a result, the RIE etch-back of the polysilicon within the mark areas proceeds at the same rate as it does in the circuit pattern areas. Thus, the process can be tuned to the requirements of the circuit pattern (e.g., cell or peripheral circuit area) without the shallow etch depth problem illustrated in FIG. 3.

Figure 4:
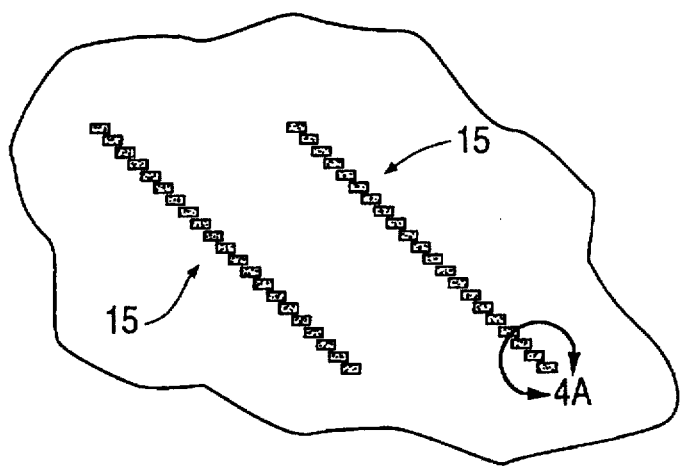
FIG. 4 is a fragmented top plan view of an alignment mark area of a semiconductor wafer, having formed therein composite alignment marks in accordance with the present invention.
Figure 4A:
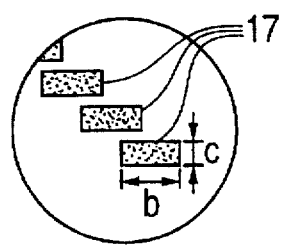
Figure 5:
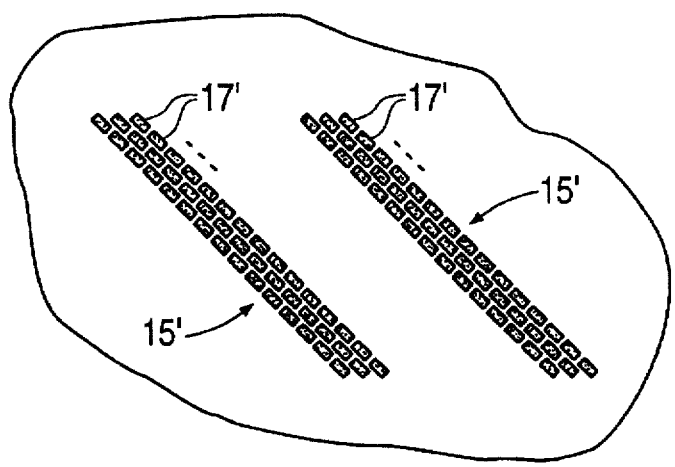
FIG. 5 is a fragmented top plan view of an alignment mark area of a semiconductor wafer, having formed therein composite alignment marks in accordance with a second embodiment of the present invention.
Figure 6:
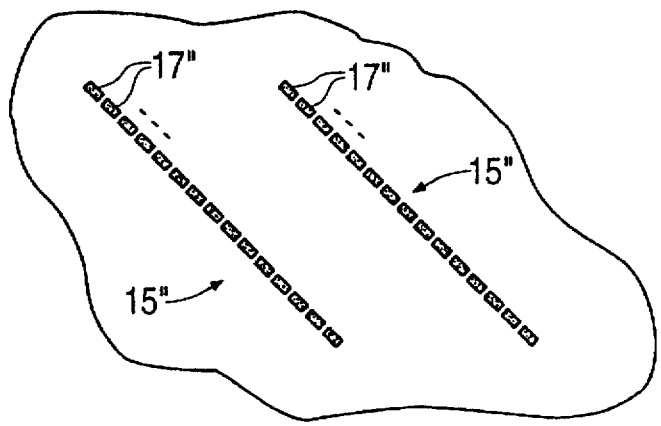
FIG. 6 is a fragmented top plan view of an alignment mark area of a semiconductor wafer, having formed therein composite alignment marks in accordance with a third embodiment of the present invention.

Exemplary composite alignment marks in accordance with the present invention are illustrated in FIGS. 4–6. As seen most clearly in the close-up view of FIG. 4, each mark 15 comprises a plurality of closely spaced smaller marks 17 which are modeled after a circuit pattern feature. In the exemplary embodiment, smaller marks 17 comprise generally rectangular holes having dimensions "b" ×"c", and an etching area, substantially corresponding to the deep trenches in the cell area of the circuit pattern of a DRAM chip. Preferably, smaller marks 17 are identical in shape and size to the relevant (simultaneously formed) circuit feature, e.g., deep trenches. Thus, if the deep trenches of the circuit pattern have a length of 0.8 μm, a width of 0.3 μm, and an etch area of 0.24 μm², small marks 17 preferably also have these dimensions. In accordance with the 256M DRAM design rule of the preferred embodiments, a deep trench has a generally rectangular shape measuring 0.55–0.8 μm by 0.3 μm, providing an etchable area of between 0.165 and 0.24 μm².

Some deviation in the size and shape of the small alignment marks from the relevant circuit pattern feature is permissible, so long as the etching characteristics are not significantly affected thereby. For example, with deep trenches having the dimensions just mentioned, small marks 17 making up alignment marks 15 could be configured as square shapes measuring 0.5 μm on each side and thus having an etch area of 0.25 μm². The permissible variation can be determined experimentally by measuring the etch rates achieved for differently shaped and sized features and determining whether any etch rate difference is likely to lead to a shallow etch depth in the mark areas.

As a rule of thumb, it is believed that the etch area of the small marks 17 should not exceed two times the etch area of the relevant circuit feature, e.g., the deep trenches. Additionally, the length dimension of the small marks should not exceed the length of the deep trenches by more than a factor of two.

The small marks are preferably closely spaced from each other so as to provide a pattern density that is substantially the same as the relevant circuit pattern. The permissible variation in spacing can be determined experimentally by measuring the etch rates achieved for different spacings and determining whether any etch rate difference is likely to lead to a shallow etch depth in the mark areas. In the case of a square mark as aforementioned, the spacing can equal the length of the mark sides or be somewhat smaller or larger. Each pattern of small marks should appear as a single large mark to the detection apparatus. Thus, the permissible spacing variation of the small marks is also dependent on the detection capabilities of the detection apparatus.

The small marks can be arranged in various patterns depending on the desired overall shape of the alignment marks. For example, as seen in FIG. 4, small marks 17 are stair-stepped length-wise to create angled line or hatch-like marks 15 having an effective width equal to the length "b" of small marks 17. Alternatively, as seen in FIG. 5, plural adjacent rows of small marks 17', arranged end to end, form marks 15' having a greater width. In the arrangement of FIG. 6, single rows of small marks 17", arranged end-m-end, create a pair of alignment marks 15" having a width equal to the width "c" of small marks 17".

Referring now to FIG. 7, the relationship between the size and spacing of the deep trenches in the circuit pattern (cell) area to the size and spacing of the small marks of the alignment marks is clearly seen. In particular, a circuit pattern area 19 comprises adjacent polysilicon filled, etched-back deep trenches 21. On the other hand, in a kerf region 23, a pair of hatch-like alignment marks 15, of the type shown in FIG. 4, comprises stair-stepped small marks 17. In accordance with a preferred embodiment of the invention, the length, width and spacing (b, c, a) of deep trenches 21 is equal to the length, width and spacing (b, c, a) of small marks 17.

The present invention has been described in terms of preferred and exemplary embodiments thereof. Numerous other embodiments, modifications and features within the scope and spirit of the appended claims will occur to persons of ordinary skill in the art upon reading this disclosure.

We claim:

1. A semiconductor integrated circuit fabrication process comprising simultaneously forming a circuit pattern feature and a photolithographic alignment mark on a semiconductor wafer by etching, said alignment mark being formed as a composite mark comprising a plurality of small marks, said small marks being sufficiently close in shape, size and spacing to said circuit pattern feature that an etch rate within an area of said circuit pattern feature and an etch rate within an area of each small mark are substantially the same.

2. A fabrication process according to claim 1, wherein said small marks have an etch area that is no larger than twice that of the circuit pattern feature.

3. A fabrication process according to claim 1, wherein a length dimension of said small marks is no larger than twice the length of said circuit pattern feature.

4. A fabrication process according to claim 1, wherein the size, shape and spacing of the small marks is substantially identical to that of the circuit pattern feature.

5. A fabrication process according to claim 1, wherein said circuit pattern feature and said small marks comprise deep trenches that are substantially identical in shape, size and spacing.

6. A fabrication process according to claim 5, wherein said deep trenches are generally rectangular shape and have an etchable area of between 0.165 and 0.24 μm².

7. A fabrication process according to claim 5, said process including the following steps for forming both the circuit pattern feature and alignment mark:

etching said deep trenches;

filling the trenches with a semiconductor material; and etching back the semiconductor material in the trenches.

8. A fabrication process according to claim 7, wherein said semiconductor material comprises polysilicon.

9. A fabrication process according to claim 1, wherein said etching is reactive ion etching.

10. A fabrication process according to claim 1, wherein the alignment mark is a mask alignment mark formed in a kerf area of the semiconductor wafer.

11. A fabrication process according to claim 1, wherein the small marks are stair-stepped to create an angled hatch-like mark having an effective width equal to a length of the small marks.

12. A fabrication process according to claim 1, wherein the small marks are arranged in plural adjacent rows to form said alignment mark.

13. A fabrication process according to claim 1, wherein the small marks are arranged end-to-end in a single row to form said alignment mark.

\* \* \* \* \*